(12) United States Patent
Ecker

(10) Patent No.: US 10,083,740 B2
(45) Date of Patent: Sep. 25, 2018

(54) RING OSCILLATOR BUILT FROM SRAM CELLS INTERCONNECTED VIA STANDARD CELL-INTERFACE

(71) Applicant: Marvell World Trade Ltd., St. Michael (BB)

(72) Inventor: Reuven Ecker, Haifa (IL)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 15/626,133

(22) Filed: Jun. 18, 2017

(65) Prior Publication Data

US 2017/0365332 A1 Dec. 21, 2017

Related U.S. Application Data

(60) Provisional application No. 62/352,913, filed on Jun. 21, 2016.

(51) Int. Cl.
*G11C 5/06* (2006.01)
*G11C 11/419* (2006.01)

(52) U.S. Cl.
CPC .................. *G11C 11/419* (2013.01)

(58) Field of Classification Search
CPC .... G11C 11/419; G11C 11/412; G11C 11/413
USPC ........................................... 365/72, 154, 156
See application file for complete search history.

(56) References Cited

U.S. PATENT DOCUMENTS

| | | | |
|---|---|---|---|
| 8,370,654 B1 | 2/2013 | Hasko et al. | |
| 9,123,446 B1 | 9/2015 | Ecker | |
| 9,465,396 B2 | 10/2016 | Moshe et al. | |
| 2012/0212997 A1* | 8/2012 | Chang | G11C 8/16 365/154 |
| 2015/0180482 A1 | 6/2015 | Bourstein et al. | |

* cited by examiner

*Primary Examiner* — Huan Hoang

(57) ABSTRACT

An Integrated Circuit (IC) includes a memory, circuit interconnections and control logic. The memory includes multiple standard-library Static Random Access Memory (SRAM) cells disposed on a substrate of the IC in multiple first layers, so that access to a respective SRAM cell to read and write data is through a cell-interface. The circuit interconnections, fabricated in one or more second layers separate from the first layers, interconnect cell-interfaces of a subgroup of the SRAM cells to form a ring oscillator that includes a cascade of N stages defined by the interconnected SRAM cells. The control logic is coupled to the cell-interfaces via the circuit interconnections, and is configured to apply an input signal to one or more of the cell-interfaces so as to trigger an oscillation of the ring oscillator whose frequency of oscillation is indicative of a speed of the SRAM cells of the memory.

16 Claims, 3 Drawing Sheets

RING OSCILLATOR BUILT FROM SRAM CELLS INTERCONNECTED VIA STANDARD CELL-INTERFACE

CROSS-REFERENCE TO RELATED APPLICATIONS

This application claims the benefit of U.S. Provisional Patent Application 62/352,913, filed Jun. 21, 2016, whose disclosure is incorporated herein by reference.

FIELD OF THE DISCLOSURE

The present disclosure relates generally to integrated circuits, and particularly to methods and systems for constructing a ring oscillator from SRAM memory cells.

BACKGROUND

Integrated Circuits (ICs) typically comprise a memory for data storage comprising multiple memory cells, such as Static Random Access Memory (SRAM) cells. Various techniques have been suggested for estimating the speed of memory cells. For example, U.S. Pat. No. 9,123,446, whose disclosure is incorporated herein by reference, describes an IC that includes a memory array, a ring oscillator and a speed determination circuit. The memory array is defined by a plurality of memory cells that are based on a memory cell design. The ring oscillator has a plurality of inversion stages formed of a plurality of modified memory cells. The memory cell design is modified at lower layers of the memory cell, independent of the memory cell port interface, to enable a dedicated coupling of the modified memory cells defining inversion stages of the ring oscillator. The speed determination circuit is configured to determine a speed of the ring oscillator.

The description above is presented as a general overview of related art in this field and should not be construed as an admission that any of the information it contains constitutes prior art against the present patent application.

SUMMARY

An embodiment that is described herein provides an Integrated Circuit (IC) that includes a memory, circuit interconnections and control logic. The memory includes multiple standard-library Static Random Access Memory (SRAM) cells disposed on a substrate of the IC in multiple first layers, so that access to a respective SRAM cell to read and write data is through a cell-interface. The circuit interconnections, fabricated in one or more second layers separate from the first layers, interconnect cell-interfaces of a subgroup of the SRAM cells to form a ring oscillator that includes a cascade of N stages defined by the interconnected SRAM cells. The control logic is coupled to the cell-interfaces via the circuit interconnections, and is configured to apply an input signal to one or more of the cell-interfaces so as to trigger an oscillation of the ring oscillator whose frequency of oscillation is indicative of a speed of the SRAM cells of the memory.

In some embodiments, all the circuit interconnections among the SRAM cells of the subgroup, for forming the ring oscillator, are made only via the cell-interfaces of the standard-library SRAM cells. In other embodiments, all the circuit interconnections among the SRAM cells of the subgroup, for forming the ring oscillator, are made without altering a topology of the standard-library SRAM cells disposed in the first layers. In yet other embodiments, the SRAM cells include eight-transistor (8T) SRAM cells, ones of the 8T SRAM cells having a storage capacity of a single bit, and the 8T SRAM cells include decoupled writing and reading circuits, the decoupled writing and reading circuits being connected to respective ports of the cell-interface.

In an embodiment, the cell-interface includes a Bit Line port and a Bit Line Bar (BLB) port for writing a bit value into the SRAM cell, and a Read Bit Line (RBL) port for reading the bit value stored in the SRAM cell, and the circuit interconnections used in forming the ring oscillator interconnect the RBL port of the SRAM cell in each stage in the cascade, excluding the last stage, to the BLB port of the SRAM cell in a subsequent stage in the cascade, and interconnect the RBL port of the SRAM cell in the last stage in the cascade to the BLB port of the SRAM cell in the first stage in the cascade. In another embodiment, the control logic is configured to apply to the cell-interfaces an enable signal that causes an enabled SRAM cell to assume a respective bit value in response to a logic level present at its respective BLB port.

In some embodiments, the control logic is configured to trigger the oscillation by temporarily pulling down a voltage level at the BLB port of the SRAM cell in the first stage of the cascade, resulting in storing a bit value in the SRAM cell of the first stage of the cascade, the bit value is propagated via the interconnections of the second layers to subsequent stages of the cascade. In other embodiments, the RBL port of the SRAM cell in a given stage is configured to flip a polarity, in response to a polarity change at the BLB port of the given stage, and to flip the polarity of the RBL port back, in response to a feedback signal from a stage that is M stages cyclically away from the given stage in the cascade, wherein 1<M<N. In yet other embodiments, the feedback signal is configured to pull down the BL port of the given SRAM cell using a pulldown transistor.

In an embodiment, a duty cycle of the oscillation of the ring oscillator depends on a ratio between M and N. In another embodiment, the cell-interface includes multiple cell-interface ports, and each of the N stages in the cascade includes two or more SRAM cells whose respective cell-interface ports are connected in parallel using the circuit interconnections.

There is additionally provided, in accordance with an embodiment that is described herein, a method including applying an input signal to a ring oscillator that includes a subgroup of multiple standard-library Static Random Access Memory (SRAM) cells of a memory, disposed on a substrate of an Integrated Circuit (IC) in multiple first layers, so that access to a respective SRAM cell to read and write data is only through a cell-interface. Circuit interconnections, fabricated in one or more second layers separate from the first layers, interconnect the cell-interfaces of the subgroup of the SRAM cells to form the ring oscillator that includes a cascade of N stages defined by the interconnected SRAM cells. A speed of the SRAM cells of the memory is estimated by measuring a frequency of oscillation of the ring oscillator that is initiated by the input signal.

There is additionally provided, in accordance with an embodiment that is described herein, a method for producing an Integrated Circuit (IC), including disposing multiple standard-library Static Random Access Memory (SRAM) cells on a substrate of the IC in multiple first layers, so that access to a respective SRAM cell to read and write data is only through a cell-interface. Interconnections are fabricated in one or more second layers of the IC, separate from the first layers, and interconnecting the cell-interfaces of a subgroup of the SRAM cells to form a ring oscillator that includes a cascade of N stages defined by the interconnected SRAM cells. Control logic fabricated in the first layers is coupled to the cell-interfaces of the SRAM cells in the subgroup via the circuit interconnections of the second layers, the control logic is designed to apply an input signal to one or more of the cell-interfaces so as to trigger an oscillation of the ring oscillator.

The present disclosure will be more fully understood from the following detailed description of the embodiments thereof, taken together with the drawings in which:

DETAILED DESCRIPTION OF EMBODIMENTS

Figure 1:
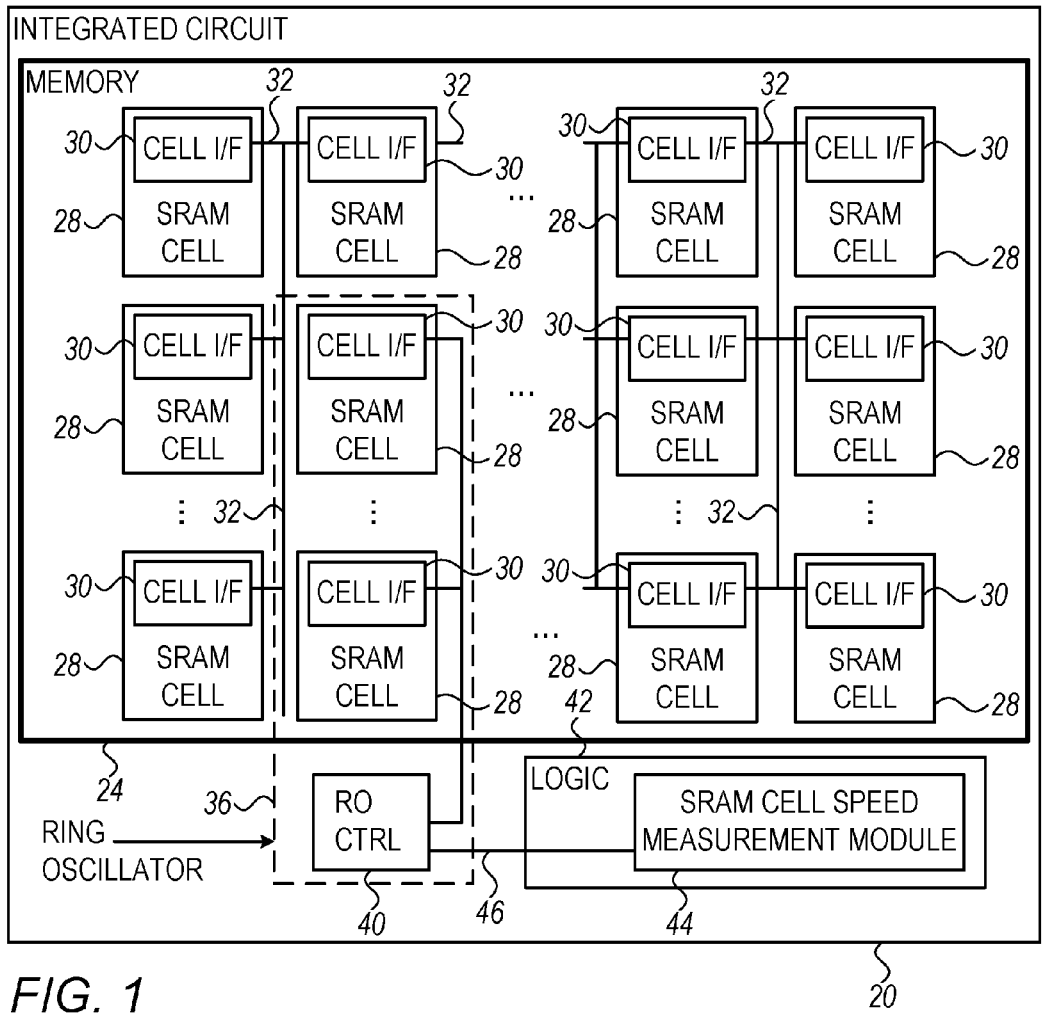
FIG. 1 is a block diagram that schematically illustrates an Integrated Circuit (IC) in which a ring oscillator constructed from standard SRAM cells of a memory is used for estimating the speed of the SRAM cells, in accordance with an embodiment that is described herein.

Embodiments that are described herein provide methods and systems for constructing a Ring Oscillator (RO) from standard-library SRAM cells conventionally used for data storage, by interconnecting the SRAM cells using their already existing standard cell-interfaces. The oscillation frequency of the ring oscillator is indicative of a speed of the SRAM cells.

The disclosed techniques are useful, for example, in ICs in which the SRAM cells are fabricated using an advanced process nodes of 20 nm or less, and/or using Mid End-of-Line (MEOL) fabrication techniques without altering the internal logic component structure of SRAM cells. It is noted that in such ICs, to satisfy the design rules used for fabrication, the cost of adding interconnections or components to SRAM cells for the sake of speed measurement can be prohibitive. In some cases it is even practically impossible to alter the internal structure of the SRAM cells. Nevertheless, the disclosed techniques are applicable in other suitable ICs and fabrication processes, as well.

In some disclosed embodiments, standard-library SRAM cells are disposed on a substrate of an Integrated Circuit (IC) in first layers, and interconnections that interconnect the cell-interfaces of the SRAM cells are fabricated in second layers of the IC, e.g., on top of the first layers. The SRAM cells are thus accessible only using the cell-interfaces designed for writing data into and reading data out of the SRAM cell. Most of the disposed SRAM cells are interconnected in a memory layout for data storage, whereas a selected group of the SRAM cells is designated to form the ring oscillator, which comprises a cascade of N stages defined by SRAM cells that are interconnected in a ring oscillator topology.

In some embodiments, the SRAM cells comprise standard eight-transistor (8T) SRAM cells, each cell having a storage capacity of a single bit. The 8T SRAM cells have decoupled writing and reading circuits, which are connected to respective ports of the cell-interface, in an embodiment.

In some embodiments, the bit output port (RBL) of each SRAM cell in the first N−1 stages is connected to the complement bit input port (BLB) of the SRAM cell of the next stage in the cascade. The RBL output port of the $N^{th}$ stage connects to the BLB input port of SRAM cell in the first stage. In addition, the bit input (BL) port of each stage is pulled down by a signal fed back from a stage located M stages away in the cascade of stages (in accordance with cyclical counting, i.e., warp the counting from the $N^{th}$ stage back to the first stage), or by an ENABLE signal provided to the RO.

When the ENABLE signal is set to a low logic level, the oscillation of the RO is disabled, and its SRAM cells are programmed to store a "0" bit value. When the ENABLE signal changes to a high logic level, the RO is enabled, causing the SRAM cell in the first stage to store a "1" bit. In response, the polarity of the RBL output port in the first stage flips, and this polarity flip propagates through the SRAM cells of subsequent stages defining the ring oscillator. The feedback signal to the BL input flips back the state of the SRAM cell after a delay of M stages. Assuming a propagation delay of Tp time units per stage, the oscillation frequency of the RO is given by $1/(N \cdot Tp)$. In addition, the duty cycle of the RO output signal is given by the ratio M/N.

In some embodiments, to set the nominal oscillation frequency and to reduce the effect of capacitive load at the BL and BLB input ports on oscillation frequency, as well as to reduce local variation effects on the oscillation frequency, each stage of the RO comprises multiple SRAM cells whose cell-interface ports are interconnected in parallel.

FIG. 1 is a block diagram that schematically illustrates Integrated Circuit (IC) 20 in which a ring oscillator constructed from standard SRAM cells of a memory is used for estimating the speed of the SRAM cells, in accordance with an embodiment that is described herein. IC 20 is suitable for use in various applications, such as in computing devices, mobile devices, storage devices, or any suitable electronic equipment that includes a SRAM-based memory.

In the present example, IC 20 comprises a memory 24 that comprises multiple SRAM cells 28. SRAM cells 28 comprise eight-transistor (8T) SRAM cells that respectively have a storage capacity of a single bit, in an embodiment. Alternatively, memory 24 may comprise SRAM cells having a number of transistors different from eight, and these SRAM cells are accessible only via their intended interfaces.

In an embodiment, some of SRAM cells 28 are used for data storage and are interconnected in a grid of Word Lines (WLs) and Bit Lines (BLs), so that multiple SRAM cells belonging to multiple respective different BLs are connected to a common WL, and are accessed simultaneously. Alternatively, other suitable interconnections of the SRAM cells, such as a three-dimensional (3-D) configuration, can also be used.

Each SRAM cell 28 comprises a cell-interface 30, designed for writing data into and reading data out of the SRAM cell. Cell-interface 30 comprises multiple ports (e.g., ports 84 in FIG. 3B below) for connecting the SRAM cell to other SRAM cells, other components of the IC and to a power source. In an embodiment, cell-interface 30 comprises at least one port for connecting to a WL and at least one port for connecting to a BL. In some embodiments, in addition to the WL and BL ports, cell-interface 30 comprises one or more additional ports for controlling the operation of the SRAM cell, as will be described below.

SRAM cells 28 are interconnected, in an embodiment, only via their respective standard cell-interfaces 30, using interconnections 32. As such, in an embodiment, the SRAM cells are accessible only via cell-interfaces 30, and any element or contact internal to the SRAM cell is inaccessible unless it is connected to a port in the cell-interface.

In IC 20, a plurality of SRAM cells 28 of memory 24 are interconnected (via the respective cell-interfaces 30 and interconnections 32) to form a Ring Oscillator (RO) 36. The SRAM cells comprising the RO are selected from among the SRAM cells of memory 24 in various ways, in an embodiment. In the example of FIG. 1, the SRAM cells comprising the RO belong to a common column, i.e., would typically connect to a common BL when used for data storage. In alternative embodiments, the SRAM cells comprising the RO belong to a common row, i.e., would typically connect to a common WL when used for data storage. Further alternatively, the SRAM cells comprising RO 36 may be selected from among the entire SRAM cells in any other suitable manner.

RO 36 comprises a RO controller 40, which connects to the cell-interfaces of the SRAM cells comprising the RO via interconnections 32, in an embodiment. RO controller 40 controls the operation of RO 36, e.g., by triggering RO 36 to start oscillating. RO controller 40 outputs an oscillation output signal 46, whose characteristics are indicative of the speed of SRAM cells 28 belonging to both the RO and memory 24. In another embodiment, oscillation output signal 46 connects to a suitable port of the cell-interface of one of the SRAM cells comprising the RO. The detailed structure of RO controller 40 and its functionality are described in greater detail below.

In FIG. 1, logic 42 implements at least some of the functionality of IC 20. Logic 42 comprises a SRAM cell speed measurement module 44, which measures the characteristics of oscillation output signal 46, e.g., for estimating the speed of SRAM cells 28 of memory 24. Methods for estimating the speed of the SRAM cells are described, for example, in U.S. Pat. No. 9,123,446, cited above. The estimated speed of the SRAM cells can be used in various applications, e.g., for generating a feedback signal to a voltage regulator that powers the IC and/or the SRAM cells, as described, for example, in U.S. Pat. No. 9,123,446, cited above.

Figure 2:
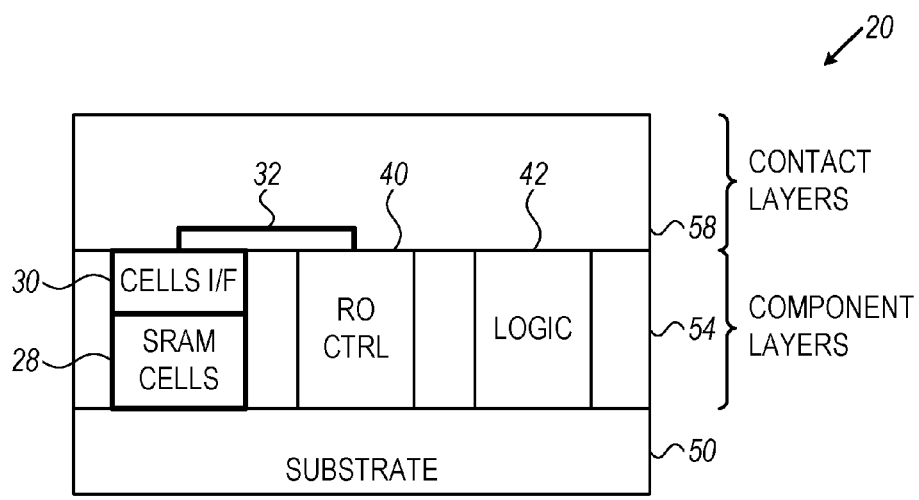
FIG. 2 is a diagram that schematically illustrates a cross-sectional view of the IC of FIG. 1, in accordance with an embodiment that is described herein.

FIG. 2 is a diagram that schematically illustrates a cross-sectional view of IC 20, in accordance with an embodiment that is described herein. In the present example, IC 20 comprises a substrate 50, one or more component layers 54 disposed on the substrate, and one or more routing layers 58 disposed on component layers 54. This configuration is given by way of example, and other suitable layer configurations, e.g., having more than two types of layers, can also be used. In addition, layers related to IC packaging are omitted for clarity.

Design rules and fabrication rules for SRAM cells 28 are typically defined in a standard library. In some disclosed embodiments, IC 20 is fabricated using advanced process nodes of 20 nm, 16 nm or less. In such advanced processes, Mid End-of-Line (MEOL) interconnects are sometimes used, in which case modifying the layout of a SRAM cell defined in the standard library, e.g., for accessing internal elements of the SRAM cell, typically results in a design rule violation. In the disclosed embodiments, to avoid such a violation, SRAM cells 28 are disposed on substrate 50 as defined by the standard library, with no modifications, and are allowed to be accessed only via the standard cell-interface as defined in the standard library.

In some embodiments, substrate 50 comprises a thin slice of semiconductor material, such as mono-crystal silicon, or any other suitable material. SRAM cells 28 and other elements of IC 20 are typically disposed on the substrate.

Component layers 54 comprise multiple layers implementing transistors and other passive and/or active elements of IC 20, such as, for example, inverters, flip-flops, logic gates and the like. Some of the elements fabricated in component layers 54 are interconnected within component layers 54 to make larger components such as SRAM cells 28, logical gates of various types and the like.

In the example of FIG. 2, RO controller and logic 42 of IC 20 are also fabricated within component layers 54. Alternatively, RO controller 40, logic 42 or both may be fabricated in layers other than component layers 54 (not shown).

Routing layers 58 comprise interconnections 32 that are entirely external to the component layers, and are used for interconnecting cell-interfaces 30 of SRAM cells 28. In some embodiments, interconnections 32 are made from metal such as copper.

In the present example, some of interconnections 32 interconnect some of SRAM cells 28 (using their cell-interfaces 30) to form a memory array for data storage, whereas other interconnections 32 interconnect a selected subgroup of SRAM cells 28 and RO controller 40 (using their respective cell-interfaces 30) to form RO 36.

In some embodiments, some or all of the elements of IC 20 in FIGS. 1 and 2 are implemented in hardware, such as using one or more Application-Specific Integrated Circuits (ASICs). In an alternative embodiment, logic 42 includes a programmable processor (not shown), which is programmed in software to carry out at least some of the functions described herein (e.g., some or all the functions of SRAM cell speed measurement module 44). The software may be downloaded to the processor in electronic form, over a network, for example, or it may, alternatively or additionally, be provided and/or stored on non-transitory tangible media, such as magnetic, optical, or electronic memory.

In the example of FIGS. 1 and 2 all the elements of IC 20 are comprised in a single die. In alternative embodiments, IC 20 comprises multiple dies that are disposed in a package and interconnected using suitable links or bus lines.

Figure 3:
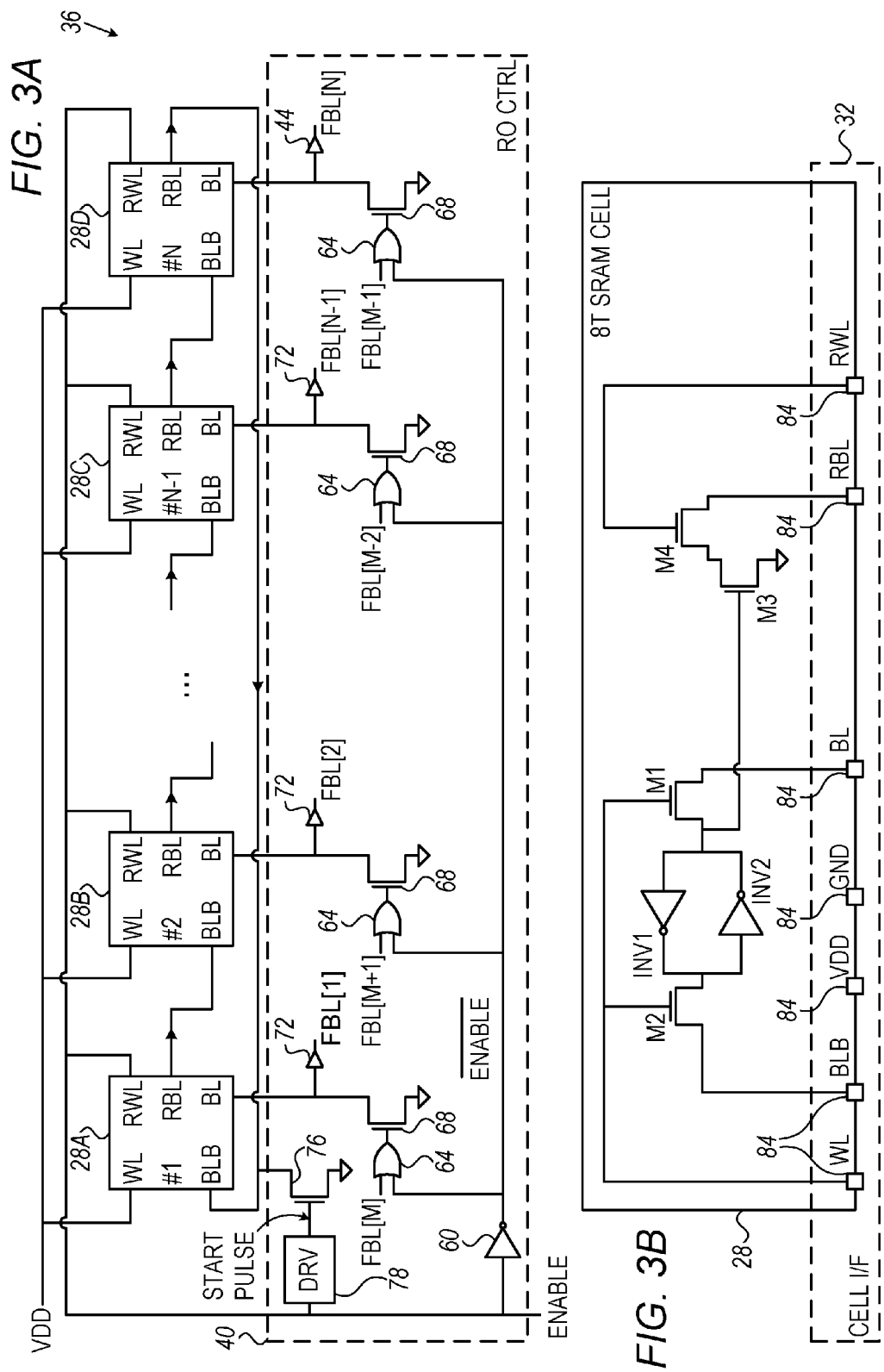
FIGS. 3A and 3B are block diagrams that schematically illustrate a ring oscillator, and an eight-transistor (8T) SRAM cell serving as a building block thereof, in accordance with an embodiment that is described herein.

FIGS. 3A and 3B are block diagrams that schematically illustrate a ring oscillator, and an eight-transistor (8T) SRAM cell serving as a building block thereof, in accordance with an embodiment that is described herein. The RO configuration depicted in FIG. 3A can be used, for example, in implementing RO 36 of FIG. 1 above.

Referring first to FIG. 3B, SRAM cell 28 is a standard SRAM cell comprising eight transistors (8T SRAM cell), as known in the art. The 8T SRAM cell stores a single bit of data in a bi-stable latch comprising two inverters denoted INV1 and INV2, wherein each of the inverters comprises two transistors (not shown). The bi-stable latch is coupled via transistors denoted M1 and M2 to a "bit line" (BL) input and to a "complement bit line" (BLB) input, respectively. The gates of transistors M1 and M2 are coupled together to a "word line" (WL) input. The combination of M1, M2, INV1 and INV2 comprise a writing circuit of the 8T SRAM cell.

SRAM cell 28 in FIG. 3B comprises additional transistors denoted M3 and M4 that together implement a reading circuit, decoupled from the writing circuit. In the embodiment seen in FIG. 3B, the gate of transistor M3 connects to the bi-stable latch, and the drain of transistor M3 connects to the source of transistor M4. The gate of transistor M4 connects to a "read word line" (RWL) input, and the source of transistor M4 connects to a "read bit line" (RBL) output. In alternative embodiments, transistor M3 in the reading circuit of the SRAM cell is connected on top of transistor M4.

In the SRAM cell configuration of FIG. 3B, the inputs WL, BL and BLB are used for writing data into the SRAM cell, whereas the control input RWL and the output RBL are used for reading the bit value stored in the SRAM cell. The writing and reading operations in the 8T SRAM cell of FIG. 3B are therefore decoupled from one another. Such decoupling provides improved stability of the 8T SRAM cell over a standard six-transistor (6T) SRAM cell.

In the example of FIGS. 3A and 3B, the SRAM cell is powered using a single voltage denoted VDD, relative to a reference voltage denoted GND. In alternative embodiments, other source power configurations can be used, such as using an additional source power voltage, e.g., VCC (not shown).

In the context of the present disclosure, a "high logic level" refers to a logic level corresponding to logic "1", and a "low logic level" refers to a logic level corresponding to logic "0". In the context of the present disclosure and in the claims, high and low logic levels are also referred to as high and low polarities. Each logic level may correspond to any suitable voltage level or range.

To write a bit value into the SRAM cell, the control input RWL is set to a low logic level (since the read mechanism is decoupled from the write mechanism, the state of the RWL input does not really matter for write operations). When in addition the input WL is set to a high logic level, the bit value represented by the complementary logic levels present at the inputs BL and BLB is stored in the bi-stable latch (comprising inverters INV1 and INV2 in the figure) of the SRAM cell. For example, when the BL input has a high logic level and the BLB input has a low logic level, a bit value "1" will be stored. Similarly, when the BL input has a low logic level and the BLB input has a high logic level, a bit value "0" will be stored. Alternatively, the bit values "0" and "1" can be defined with logic level polarities opposite to those described above.

To read the bit value stored in the SRAM cell, the control input RWL is set to a high logic level and the bit value stored can be sensed at the RBL output. Specifically, transistor M3 becomes conductive only when the bit value at the output of INV2 is "1" causing the RBL output to discharge. Otherwise, the RBL output remains charged.

Cell-interface 30 of SRAM cell 28 comprises multiple ports 84. In the context of the present disclosure and in the claims, the term "port" refers to any contact element of the SRAM cell via which the SRAM cell can be accessed and/or controlled. In FIG. 3B, ports 84 comprise input ports WL, BL and BLB that are used for writing, control port RWL, read output port RBL and source power ports VDD and GND.

In the present disclosure we assume that SRAM cell 28 is accessible only via ports 84 of the cell-interface. For example, the inputs and outputs of, or any component internal to inverters INV1 and INV2 cannot be accessed because these inverters have no direct electrical connection to any port in the cell-interface.

RO 36 of FIG. 3A comprises a cascade of stages numbered #1 . . . #N. In some embodiments, each of these N stages comprises the 8T SRAM cell 28 of FIG. 3B. The WL input of each of the SRAM cells in FIG. 3A is connected to VDD, which causes these SRAM cells to be selected for writing at all times. This means that changing the bit value stored in the SRAM cells is not synchronized to any clock or other signal. Instead, the RO in FIG. 3A operates in an asynchronous manner, by propagating signals through the cascade of stages, as will be described below.

The control ports RWL of the SRAM cells in FIG. 3A connect to an ENABLE signal. When the ENABLE signal is set to a low logic level, the RBL outputs of the SRAM cells are forced to a high impedance, and the RO is disabled from oscillating. When the ENABLE signal is set to a high logic level, the RBL outputs reflect the bit values stored in the respective SRAM cells, and the RO is enabled to oscillate.

In some embodiments, the RO controller is configured to apply to the cell-interfaces of the SRAMs an enable signal that causes an enabled SRAM cell to assume a respective bit value in response to a logic level present at its respective BLB port.

The RBL output port of each SRAM cell in the cascade of stages #1 to #N−1 connects to the BLB input port of the next stage in the cascade. For example, the RBL output of SRAM cell 28A connects to the BLB input of SRAM cell 28B, and so on. In addition, the RBL output of the SRAM cell at the last stage in the cascade connects back to the BLB input of the SRAM cell in the first stage, i.e., SRAM cell 28A.

RO controller 40 of RO 36 is depicted in dotted lines in FIG. 3A. The RO controller controls the states of the BL inputs of the SRAM cells in stages #1 . . . #N, as well as the BLB input of the SRAM cell in stage #1. The BL input of each SRAM cell of the RO is controlled by a respective pull-down transistor 68, whose gate is connected to a two-input logical OR gate 64. One input of OR gate 64 receives a signal $\overline{\text{ENABLE}}$ that is the logical complement of the ENABLE signal and that is generated using an ENABLE-inverter gate 60. When the logic level of the ENABLE signal is low, the outputs of OR gates 64 are forced to a high logic level, and the BL inputs of the SRAM cells are pulled down to a low logic level by pull-down transistors 68. In addition, the BLB inputs of the SRAM cells are set to a high impedance, and the SRAM cells in all the stages are programmed to store a default bit value (e.g., "0").

RO controller 40 comprises N buffers 72 connected to the BL inputs of the SRAM cells in the respective N stages. The outputs of buffers 72 are denoted FBL[1], FBL[2], . . . , FBL[N], corresponding to the respective stage indices. The buffered outputs FBL[n], n=1 . . . N are fed back to OR gates 64 with a cyclic shift of M stages. For example, FBL[M] is fed back to OR gate 64 corresponding to stage #1, FBL[M+1] is fed back to OR gate 64 corresponding to stage #2, and so on. As another example, the buffered output FBL(N) of the $N^{th}$ stage is fed back to OR gate 64 of the stage indexed (N−M+1). When a buffered output FBL[n] goes to a high logic level, the corresponding pull-down transistor 68 becomes conductive and forces the respective BL input to a low logic level, which programs a "0" bit into the SRAM cell of the respective stage.

The RBL outputs of the SRAM cells change in response to the occurrence of the events: (i) the RBL output changes from a high logic level to a low logic level in response to a polarity change at the respective BLB input from a high logic level to a low logic level, and (ii) the RBL output changes back from a low logic level to a high logic level, in response to a polarity change of a respective feedback signal (FBL) from a low logic level to a high logic level. The changes in the polarity at the RBL outputs propagate along the cascade of stages, wherein each stage contributes its own propagation delay.

The oscillations of RO 36 are triggered using a triggering transistor 76. The source of triggering transistor 76 is connected to the BLB input of the SRAM cell in stage #1, and the gate of triggering transistor 76 connects to the output of a driver 78, which produces a start pulse in response to a rising edge of the ENABLE signal. The start pulse causes triggering transistor 76 to pull down the voltage level at the BLB input of the SRAM in stage #1, which programs the SRAM cell of the first state to bit "1," which in turn causes the respective RBL output to change to a low logic level.

Figure 4:
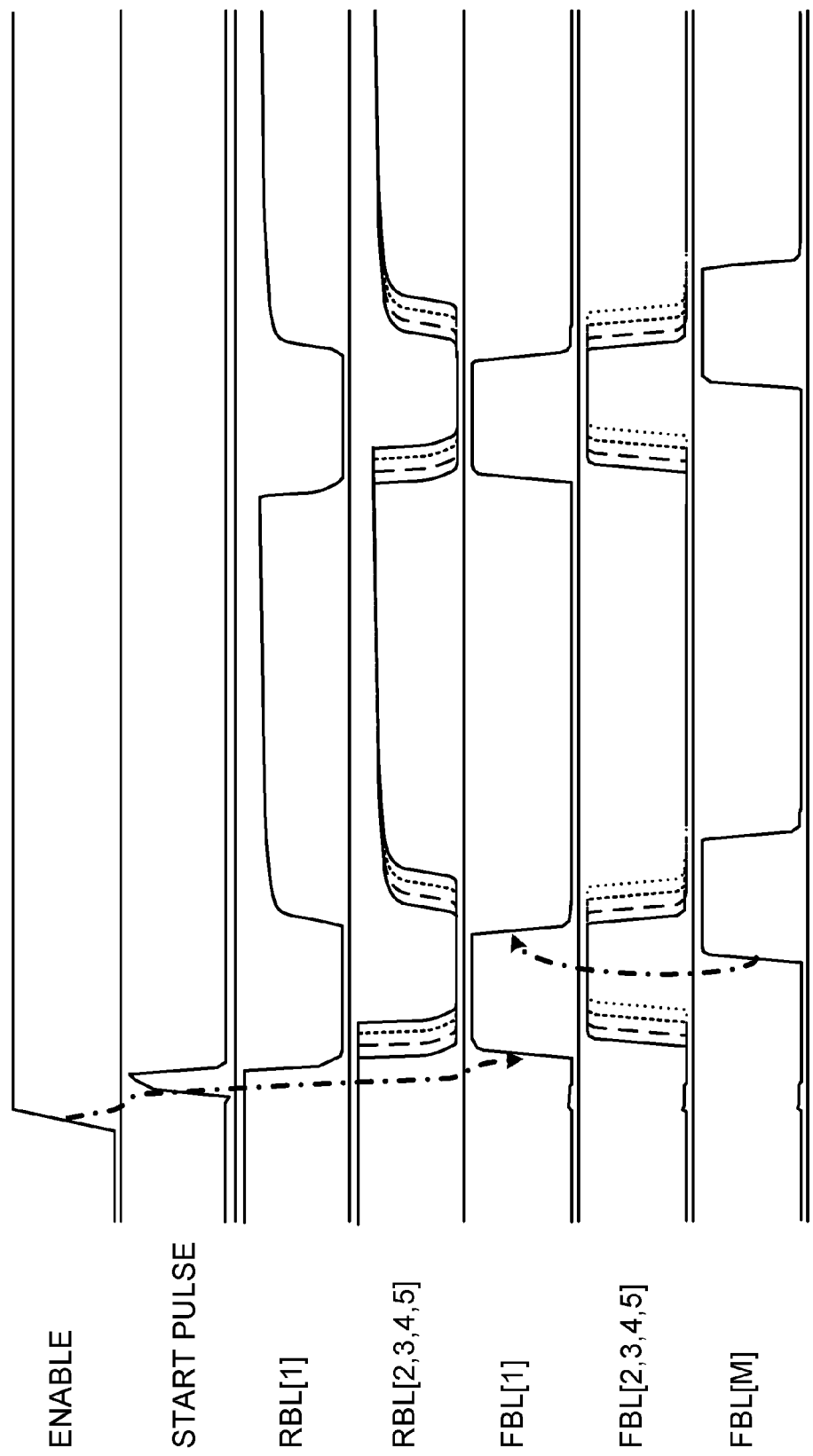
FIG. 4 is a timing diagram that schematically illustrates the dynamic operation of the ring oscillator of FIG. 3A, in accordance with an embodiment that is described herein.

FIG. 4 is a timing diagram that schematically illustrates the dynamic operation of the ring oscillator of FIG. 3A, in accordance with an embodiment that is described herein. In FIG. 4, the RBL output of an SRAM cell of the $n^{th}$ stage is denoted RBL[n].

The two upper signals in FIG. 4 depict the ENABLE signal provided to the RO controller and the start pulse derived by driver 78. As noted above, as long as the logic level of the ENABLE signal is low, the SRAM cells of all the N stages are programmed to bit value "0" and all the respective RBL outputs are at a high logic level. In addition, before the ENABLE signal changes to a high logic level, all the buffered outputs FBL[n], n=1 . . . N, are initialized to a low logic level.

The start pulse pulls the BLB input of the SRAM cell of stage #1 causing this SRAM to store a bit value "1," which also causes the output RBL[1] of the SRAM cell in the first stage to change from a high logic level to a low logic level. By pulling the BLB input down, the start pulse additionally causes a "1" value at the BL port, which causes the buffered output FBL[1] to change to a high logic level.

The polarity change of FBL[1] from a low logic level to a high logic level propagates through subsequent stages, wherein each stage adds its respective propagation delay. In each stage, changing the value of the stored bit to "1" causes also a "1" value at the respective BL port and at the output its respective buffer 72. When FBL[M] changes to a high logic level, the BL input of the SRAM cell in the first stage is pulled down via the respective OR gate 64 and pull-down transistor 68, which causes FBL[1] to change back to a low logic level, and the RBL output of the first stage to change back to a high logic level (note that the level of the RBL output of the SRAM cell in the first stage actually goes up only when the content of SRAM cell is stage #2 flips to "0").

The change of the RBL output of the first stage from a high logic level to a low logic level propagates via the SRAM cells of subsequent stages in the cascade, and when the RBL output of the SRAM cell in stage #N changes to a low logic level, the SRAM cell of the first stage flips state and the RBL output of stage #1 changes to a low logic level. The cycle described above continues as long as the ENABLE signal remains at a high logic level.

The duration of the oscillation cycle depends on the number of stages N and on the propagation delay from the BLB input to the RBL output of each stage. Assuming a uniform propagation delay of Tp time units, the overall cycle duration is given by N·Tp, and the oscillation frequency of RO 36 in FIG. 3A is given by RO_FREQ=1/(N·Tp).

By measuring the frequency of the oscillations of RO 36, e.g., using speed measurement module 44, the speed of the SRAM cells can be estimated as Tp=1/(N·RO_FREQ).

Given the number of stages N, the duty cycle of the RO oscillations depend on the number M and on the propagation delay from the RBL output of the SRAM cell in stage #n to the RBL output of the SRAM cell in stage # (n+1), which is assumed to be Tp time units. The duty cycle of the oscillations is therefore given by the ratio M/N. For example, for a RO having N=20 stages and M=5, the oscillation duty cycle is 5/20 or 25%.

In some embodiments, the BL and BLB inputs have a large capacitive load, which may slow down the writing operation of the SRAM cell considerably. In the context of the present disclosure, the capacitive load of the BL inputs relates to a diffusion capacitance of pull-down transistor 68 and an input capacitance of buffer 72. In the first stage, the capacitive load of the BLB input relates to the capacitance of triggering transistor 76. In some embodiments, to reduce the effect of the capacitive load of the BL and BLB inputs on the propagation delay Tp, each of the N stages comprises multiple SRAM cells 28 interconnected in parallel. In an embodiment, eight SRAM cells are connected in parallel per stage. Alternatively, any other number of SRAM cells per stage can also be used. In the context of the present disclosure, connecting multiple SRAM cells in parallel means that the ports in the cell-interfaces of the multiple SRAM cells of the stage having a common functionality (e.g., BL, BLB, WL, and the like) are interconnected together using interconnections 32 (FIG. 2). For example, the BL ports of all the SRAM cells that belong to a common stage are interconnected to one another.

The embodiments described above are given by way of example, and alternative suitable embodiments can also be used. For example, although in the description above we refer mainly to SRAM cells having a standard eight-transistor configuration, the disclosed embodiments are also applicable to other suitable SRAM cell configurations such as non-standard SRAM cell having eight transistors, or SRAM cells comprising a number of transistors other than eight.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
   a memory comprising multiple standard-library Static Random Access Memory (SRAM) cells disposed on a substrate of the IC in multiple first layers;
   circuit interconnections, fabricated in one or more second layers separate from the first layers, the circuit interconnections configured to interconnect a subgroup of the standard-library SRAM cells to form a ring oscillator that comprises a cascade of N stages defined by the interconnected SRAM cells, wherein access both to the SRAM cells that form the ring oscillator, and to the other SRAM cells in the memory, is performed only via identical, unmodified, standard-cell cell-interfaces of the standard-library SRAM cells; and
   control logic, coupled to the cell-interfaces via the circuit interconnections, the control logic being configured to apply an input signal to one or more of the cell-interfaces so as to trigger an oscillation of the ring oscillator, wherein a frequency of the oscillation is indicative of a speed of the SRAM cells of the memory.

2. The IC according to claim 1, wherein all the circuit interconnections among the SRAM cells of the subgroup, for forming the ring oscillator, are made without altering a topology of the standard-library SRAM cells disposed in the first layers.

3. The IC according to claim 1, wherein the SRAM cells comprise eight-transistor (8T) SRAM cells, ones of the 8T SRAM cells having a storage capacity of a single bit, and wherein the 8T SRAM cells comprise decoupled writing and reading circuits, the decoupled writing and reading circuits being connected to respective ports of the cell-interface.

4. The IC according to claim 1, wherein the cell-interface comprises a Bit Line port and a Bit Line Bar (BLB) port for writing a bit value into the SRAM cell, and a Read Bit Line (RBL) port for reading the bit value stored in the SRAM cell, and wherein the circuit interconnections used in forming the ring oscillator interconnect the RBL port of the SRAM cell in each stage in the cascade, excluding the last stage, to the BLB port of the SRAM cell in a subsequent stage in the cascade, and interconnect the RBL port of the SRAM cell in the last stage in the cascade to the BLB port of the SRAM cell in the first stage in the cascade.

5. The IC according to claim 4, wherein the control logic is configured to apply to the cell-interfaces an enable signal that causes an enabled SRAM cell to assume a respective bit value in response to a logic level present at its respective BLB port.

6. The IC according to claim 4, wherein the control logic is configured to trigger the oscillation by temporarily pulling down a voltage level at the BLB port of the SRAM cell in the first stage of the cascade, resulting in storing a bit value in the SRAM cell of the first stage of the cascade, the bit value is propagated via the interconnections of the second layers to subsequent stages of the cascade.

7. The IC according to claim 4, wherein the RBL port of the SRAM cell in a given stage is configured to flip a polarity, in response to a polarity change at the BLB port of the given stage, and to flip the polarity of the RBL port back, in response to a feedback signal from a stage that is M stages cyclically away from the given stage in the cascade, wherein $1<M<N$.

8. The IC according to claim 7, wherein the feedback signal is configured to pull down the BL port of the given SRAM cell using a pulldown transistor.

9. The IC according to claim 7, wherein a duty cycle of the oscillation of the ring oscillator depends on a ratio between M and N.

10. The IC according to claim 1, wherein the cell-interface comprises multiple cell-interface ports, and wherein each of the N stages in the cascade comprises two or more SRAM cells whose respective cell-interface ports are connected in parallel using the circuit interconnections.

11. A method, comprising:
applying an input signal to a ring oscillator comprising a subgroup of multiple standard-library Static Random Access Memory (SRAM) cells of a memory, disposed on a substrate of an Integrated Circuit (IC) in multiple first layers, wherein circuit interconnections, fabricated in one or more second layers separate from the first layers, interconnect the cell-interfaces of the subgroup of the SRAM cells to form the ring oscillator that comprises a cascade of N stages defined by the interconnected SRAM cells, wherein access both to the SRAM cells that form the ring oscillator, and to the other SRAM cells in the memory, is performed only via identical, unmodified, standard-cell cell-interfaces of the standard-library SRAM cells; and
estimating a speed of the SRAM cells of the memory by measuring a frequency of oscillation of the ring oscillator that is initiated by the input signal.

12. The method according to claim 11, and comprising applying to the cell-interfaces an enable signal that causes an enabled SRAM cell to assume a respective bit value in response to a logic level present at its respective BLB port.

13. The method to claim 11, wherein triggering the oscillation comprises temporarily pulling down a voltage level at the BLB port of the SRAM cell in the first stage of the cascade, resulting in storing a bit value in the SRAM cell of the first stage of the cascade, the bit value is propagated via the interconnections of the second layers to subsequent stages of the cascade.

14. A method for producing an Integrated Circuit (IC), comprising:
disposing multiple standard-library Static Random Access Memory (SRAM) cells on a substrate of the IC in multiple first layers;
fabricating interconnections in one or more second layers of the IC, separate from the first layers, and interconnecting the cell-interfaces of a subgroup of the SRAM cells to form a ring oscillator that comprises a cascade of N stages defined by the interconnected SRAM cells, wherein access both to the SRAM cells that form the ring oscillator, and to the other SRAM cells in the memory, is performed only via identical, unmodified, standard-cell cell-interfaces of the standard-library SRAM cells; and
coupling control logic fabricated in the first layers to the cell-interfaces of the SRAM cells in the subgroup via the circuit interconnections of the second layers, wherein the control logic is designed to apply an input signal to one or more of the cell-interfaces so as to trigger an oscillation of the ring oscillator.

15. The method according to claim 14, wherein interconnecting the cell-interfaces comprises interconnecting all of the SRAM cells of the subgroup for forming the ring oscillator without altering a topology of the standard-library SRAM cells disposed in the first layers.

16. The method according to claim 14, wherein disposing the SRAM cells comprises disposing eight-transistor (8T) SRAM cells, ones of the 8T SRAM cells having a storage capacity of a single bit, wherein the 8T SRAM cells comprise decoupled writing and reading circuits, the decoupled writing and reading circuits being connected to respective ports of the cell-interface.

\* \* \* \* \*